US012609069B2

(12) United States Patent
Choi

(10) Patent No.: US 12,609,069 B2
(45) Date of Patent: Apr. 21, 2026

(54) RESET CIRCUIT AND TIMING CONTROLLER INCLUDING THE SAME

(71) Applicant: LX SEMICON CO., LTD., Daejeon (KR)

(72) Inventor: Sang Dae Choi, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 149 days.

(21) Appl. No.: 18/426,658

(22) Filed: Jan. 30, 2024

(65) Prior Publication Data

US 2024/0257703 A1 Aug. 1, 2024

(30) Foreign Application Priority Data

Jan. 30, 2023 (KR) ........................ 10-2023-0011904

(51) Int. Cl.
| | |
|---|---|
| *G09G 3/20* | (2006.01) |
| *H03K 3/037* | (2006.01) |
| *H03K 5/13* | (2014.01) |
| *H03K 19/20* | (2006.01) |

(52) U.S. Cl.
CPC ........... *G09G 3/2096* (2013.01); *H03K 3/037* (2013.01); *H03K 5/13* (2013.01); *G09G 2300/0814* (2013.01); *G09G 2310/0243* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 2007/0170960 A1* | 7/2007 | Sakai | ..................... | H03K 17/22 |
| | | | | 327/142 |
| 2008/0111605 A1* | 5/2008 | Yoshikawa | ............ | H03K 17/22 |
| | | | | 327/198 |
| 2016/0182020 A1* | 6/2016 | Jalan | ..................... | H03K 3/037 |
| | | | | 327/198 |
| 2017/0179954 A1* | 6/2017 | Fanet | ..................... | H03K 19/20 |

* cited by examiner

*Primary Examiner* — Nicholas J Lee
(74) *Attorney, Agent, or Firm* — ROTHWELL, FIGG, ERNST & MANBECK, P.C.

(57) ABSTRACT

Disclosed is a reset circuit including a low voltage detecting circuit receiving a power signal and outputting a signal, the low voltage detecting circuit including a first cell configured to receive the power signal and output the voltage corresponding to the logic "0" based on the power signal being smaller than a threshold voltage or a voltage corresponding to logic "1" based on the power signal being greater than the threshold voltage, at least one second cell connected in series to the first cell and outputting a signal inputted from the first cell after delaying the signal for a predetermined delay time, and a third cell outputting a low voltage reset signal by receiving all signals outputted from the first cell and the at least one second cell.

19 Claims, 6 Drawing Sheets

200

Hsync
Vsync
DE

210

Control signal generating circuit

DCS
GCS

220

RGB

Video signal converting circuit

RGB'

230

VDD
e_RST

Reset circuit i_RST

RESET CIRCUIT AND TIMING CONTROLLER INCLUDING THE SAME

BACKGROUND OF THE DISCLOSURE

Pursuant to 35 U.S.C. § 119(a), this application claims the benefit of earlier filing date and right of priority to Korean Application No. 10-2023-0011904, filed on Jan. 30, 2023, the contents of which are hereby incorporated by reference herein in their entirety.

Technical Field

The present disclosure relates to a reset circuit and timing controller including the same.

Background

Examples of display devices that display images include Liquid Crystal Display (LCD) devices using liquid crystals and Organic Light Emitting Diode (OLED) display devices using organic light emitting diodes.

The display device displays an image in a manner that a display panel is supplied with a video signal by a display driving device including a timing controller, a data driving unit, a gate driving unit, a power supply unit, etc. In this case, if an excessively small power voltage is supplied to the display device, the display driving device may include a reset circuit for resetting the display device.

SUMMARY

Accordingly, the present disclosure is directed to a reset circuit and timing controller including the same that substantially obviate one or more problems due to limitations and disadvantages of the related art.

One object of the present disclosure is to provide a reset circuit and timing controller including the same, which may not need to set up a reference voltage to detect a low voltage.

To achieve these objects and other advantages and in accordance with the purpose of the disclosure, as embodied and broadly described herein, a reset circuit according to one embodiment of the present disclosure may include a low voltage detecting circuit receiving a power signal and outputting a signal corresponding to logic "0" for a time taken to input the power signal of a voltage corresponding to the logic "0" and a predetermined delay time based on the power signal being the voltage corresponding to the logic "0", the low voltage detecting circuit including a first cell configured to receive the power signal and output the voltage corresponding to the logic "0" based on the power signal being smaller than a threshold voltage or a voltage corresponding to logic "1" based on the power signal being greater than the threshold voltage, at least one second cell connected in series to the first cell and outputting a signal inputted from the first cell after delaying the signal for a predetermined delay time, and a third cell outputting a low voltage reset signal by receiving all signals outputted from the first cell and the at least one second cell.

Accordingly, the present disclosure provides the following effects and/or advantages.

First, a rest circuit and timing controller including the same according to one embodiment of the present disclosure may design a reset circuit with ease using a standard cell.

Second, a rest circuit and timing controller including the same according to one embodiment of the present disclosure may detect a low voltage using a threshold voltage by a schedule variance of a standard cell.

In addition to the above explicitly mentioned technical effects, the advantages that can be inferred through the entire purpose of the specification and drawings will naturally fall within the scope of the present disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
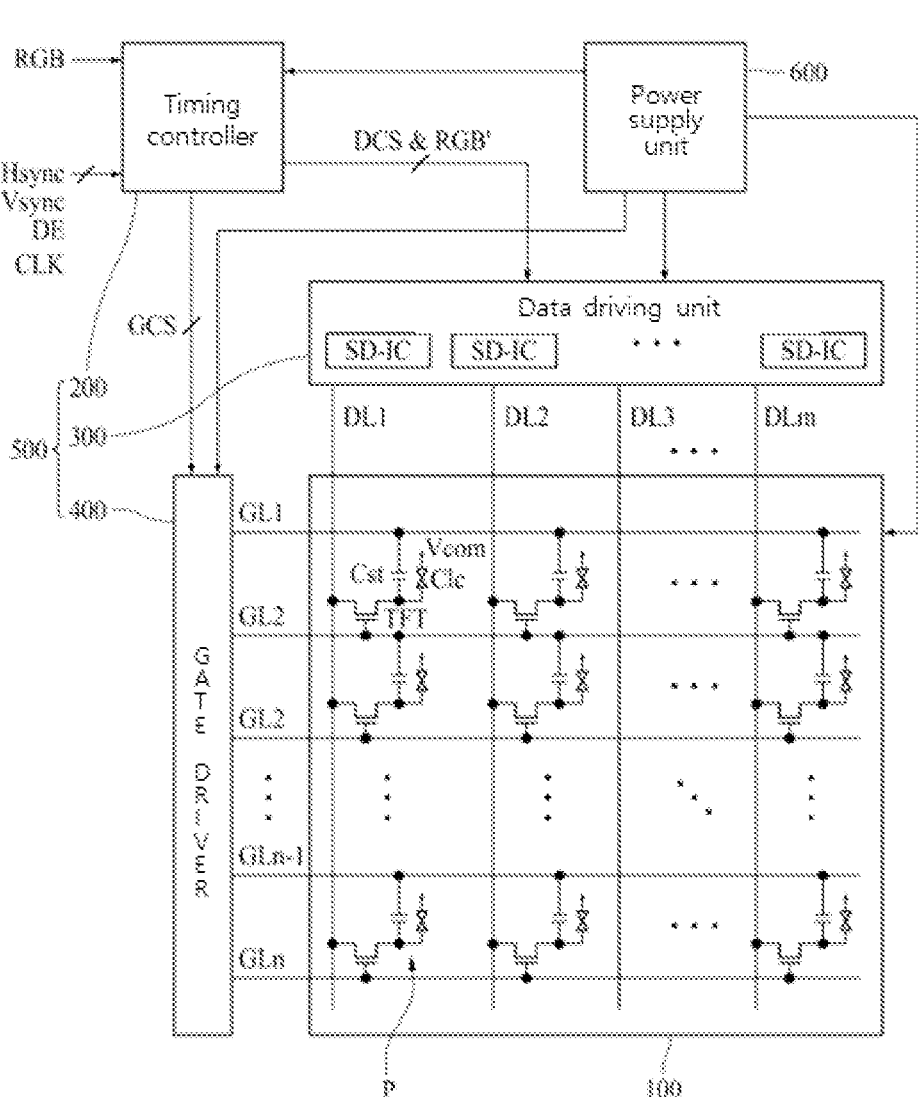
FIG. 1 is a diagram illustrating a configuration of a display device including a timing controller according to one embodiment of the present disclosure.

Throughout the specification, like reference numerals are used to refer to substantially the same components. In the following description, detailed descriptions of components and features known in the art may be omitted if they are not relevant to the core configuration of the present disclosure. The meanings of terms used in this specification are to be understood as follows.

The advantages and features of the present disclosure, and methods of achieving them, will become apparent from the detailed description of the embodiments, together with the accompanying drawings. However, the present disclosure is not limited to the embodiments disclosed herein and will be implemented in many different forms. The embodiments are provided merely to make the disclosure of the present disclosure thorough and to fully inform one of those skilled in the art to which the present disclosure belongs of the scope of the disclosure. It is to be noted that the scope of the present disclosure is defined only by the claims.

The figures, dimensions, ratios, angles, numbers of elements given in the drawings are merely illustrative and are not limiting. Like reference numerals refer to like elements throughout the specification. Further, in describing the present disclosure, descriptions of well-known technologies may be omitted in order to avoid obscuring the gist of the present disclosure.

As used herein, the terms "includes," "has," "comprises," and the like should not be construed as being restricted to the means listed thereafter unless specifically stated otherwise. Where an indefinite or definite article is used when referring to a singular noun e.g. "a" or "an", "the", this includes a plural of that noun unless something else is specifically stated.

Elements are to be interpreted a margin of error, even if not explicitly stated otherwise.

In describing temporal relationships, terms such as "after," "subsequent to," "next to," "before," and the like may include cases where any two events are not consecutive, unless the term "immediately" or "directly" is explicitly used.

While the terms first, second, and the like are used to describe various elements, the elements are not limited by these terms. These terms are used merely to distinguish one element from another. Accordingly, a first element referred to herein may be a second element within the technical idea of the present disclosure.

It should be understood that the term "at least one" includes all possible combinations of one or more related items. For example, the phrase "at least one of the first, second, and third items" can mean each of the first, second, or third items, as well as any possible combination of two or more of the first, second, and third items.

Features of various embodiments of the present disclosure can be partially or fully combined together. As will be clearly appreciated by those skilled in the art, various interactions and operations are technically possible. Embodiments can be practiced independently of each other or in conjunction with each other.

Hereinafter, a display device including a timing controller according to one embodiment of the present disclosure will be described with reference to FIG. 1. FIG. 1 is a diagram illustrating a configuration of a display device including a display driving device according to one embodiment of the present disclosure.

Referring to FIG. 1, a display device 10 includes a display panel 100 and a display driving device 500.

The display panel 100 includes a plurality of gate lines GL1 to GLn arranged in a manner of crossing with each other to define a plurality of pixel areas, a plurality of data lines DL1 to DLm, and pixels P provided in a plurality of the pixel areas, respectively. A plurality of the gate lines GL1 to GLn may be arranged in a horizontal direction and a plurality of the data lines DL1 to DLm may be arranged in a vertical direction, which are non-limited thereto.

The display panel 100 may include a liquid crystal display (LCD) panel. When the display panel 100 is the liquid crystal display panel, the display panel 100 includes thin film transistors TFT formed in pixel areas defined by a plurality of the gate lines GL1 to GLn and a plurality of the data lines DL1 to DLm, and liquid crystal cells connected to the thin film transistors TFT, respectively.

The thin film transistors TFT supply data signals supplied through the data lines DL1 to DLm to the liquid crystal cells in response to scan pulses supplied through the gate lines GL1 to GLn, respectively.

Since the liquid crystal cell is composed of a common electrode and a sub-pixel electrode connected to the thin film transistor TFT, which face each other while leaving liquid crystals in-between, it may be equivalently expressed as a liquid crystal capacitor Clc. Such a liquid crystal cell includes a storage capacitor Cst connected to the gate line of a previous stage to maintain a source signal charged in the liquid crystal capacitor Clc until a next source signal is charged therein.

Meanwhile, the pixel area of the display panel 100 may include red (R), green (G), blue (B), and white (W) subpixels. The respective subpixels may be repeatedly formed in a row direction or may be formed in a 2*2 matrix. In this case, a color filter corresponding to each color is disposed in each of the red (R), green (G), and blue (B) subpixels, while a separate color filter is not disposed in the white (W) subpixel. The red (R), green (G), blue (B), and white (W) subpixels may be formed to have the same area ratio, but may also be formed to have different area ratios.

Although the display panel 100 is described as a liquid crystal display panel, the display panel 100 may include an organic light emitting display panel in which an Organic Light Emitting Diode (OLED) is formed in each pixel area.

In addition, although not shown, the display panel 100 may be integrally formed with a touch panel to serve as a touch panel for touch sensing.

The display driving device 500 includes a timing controller 200, a data driving unit 300, a gate driving unit 400, and a power supply unit 600. Also, although not shown, the display driving device 500 may further include a touch driving device.

The timing controller 200 receives various timing signals including a vertical synchronization signal Vsync, a horizontal synchronization signal Hsync, a data enable signal DE, a clock signal CLK, and the like from an external system (not shown), and generates a data control signal DCS for controlling the data driving unit 300 and a gate control signal GCS for controlling the gate driving unit 400. In addition, the timing controller 200 receives a video signal RGB from the external system, converts the video signal RGB into a video signal RGB' of a type that may be processed by the data driving unit 140, and outputs the same. Also, although not shown, the timing controller 200 may generate a touch synchronization signal Tsync that time-divisions one frame period into a display period and a touch sensing period in accordance with the timing of an internal data enable signal iDE generated by using the vertical synchronization signal Vsync and the data enable signal DE.

According to one embodiment of the present disclosure, included is a reset circuit capable of efficiently resetting the display device 10 and the timing controller 200 when adequate power is not supplied to the timing controller 200. This will be described in detail later with reference to FIGS. 2 to 4.

The data driving unit 300 converts the aligned video signal RGB' into a source signal according to the data control signal DCS generated by the timing controller 200. The data control signal DCS may include a Source Start Pulse (SSP), a Source Sampling Clock (SSC), a Source Output Enable signal (SOE), and the like. Here, the source start pulse controls a data sampling start timing of a signal converting unit. The source sampling clock is a clock signal that controls a sampling timing of data in each of the source driver ICs. The source output enable signal controls an output timing of the signal converting unit of each source driver IC (SDIC). That is, the data driving unit 300 converts the aligned video signal RGB' into a source signal according to the source start pulse, the source sampling clock, and the source output enable signal, and outputs a source signal of one horizontal line to the data lines for each horizontal period in which a gate signal is supplied to a gate line. In this case, the signal converting unit is supplied with a gamma voltage from a gamma voltage generating unit (not shown), and may convert the aligned video signal RGB' into a source signal using the gamma voltage. To this end, the data driving unit 300 includes n source driver ICs SD-IC.

The gate driving unit 400 outputs the gate signal synchronized with the source signals generated by the data driving unit 300 to the gate line according to the gate control signal GCS generated by the timing controller 200. The gate control signal GCS may include a Gate Start Pulse (GSP), a Gate Shift Clock (GSC), a Gate Output Enable signal, and the like. Here, the gate start pulse controls the operation start timing of m gate driver ICs (not shown) constituting the gate driving unit 400. The gate shift clock is a clock signal commonly inputted to one or more gate drive ICs and controls a shift timing of a scan signal (gate pulse). The gate output enable signal designates timing information of one or more gate driver ICs.

The gate driving unit 400 includes a gate shift register circuit, a gate level shifter circuit, and the like. In this case, the gate shift register may be directly formed on a TFT array substrate of the display panel 100 through a Gate In Panel (GIP) process. In this case, the gate driving unit 400 supplies a gate start pulse and a gate shift clock signal to a gate shift register unit formed on the TFT array substrate by the GIP.

The power supply unit 600 supplies the voltage for driving the display panel 100, the display driving device 500, and the external system (not shown). The power supply unit 600 generates a voltage according to a driving voltage of each circuit included in the display driving device 500, and supplies the voltage to each circuit. The power supply unit 600 supplies the display panel 100 with power for driving the display panel 100 to enable the display panel 100 to operate.

Hereinafter, a reset circuit and timing controller including the same according to one embodiment of the present disclosure will be described in detail with reference to FIGS. 2 to 4.

Figure 2:
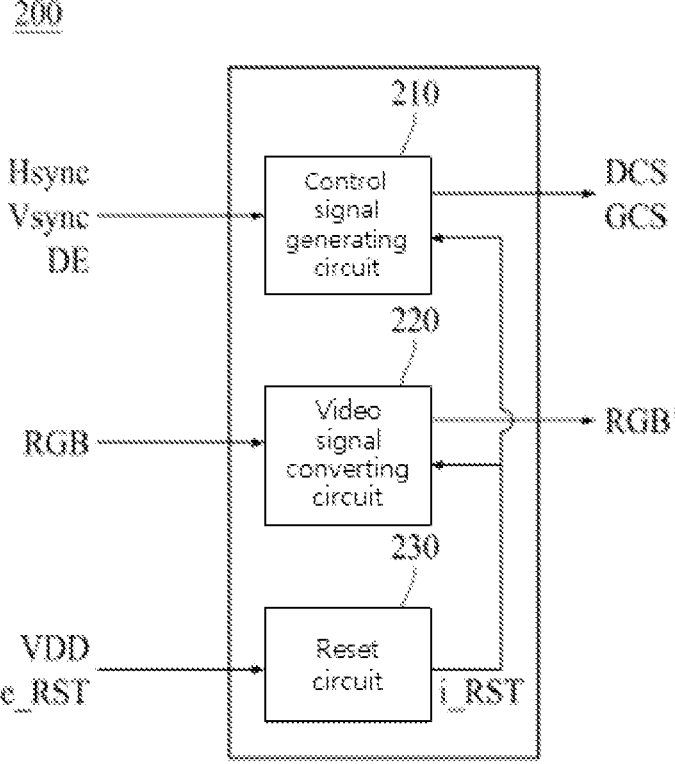
FIG. 2 is a schematic block diagram of a timing controller according to one embodiment of the present disclosure.
Figure 3:
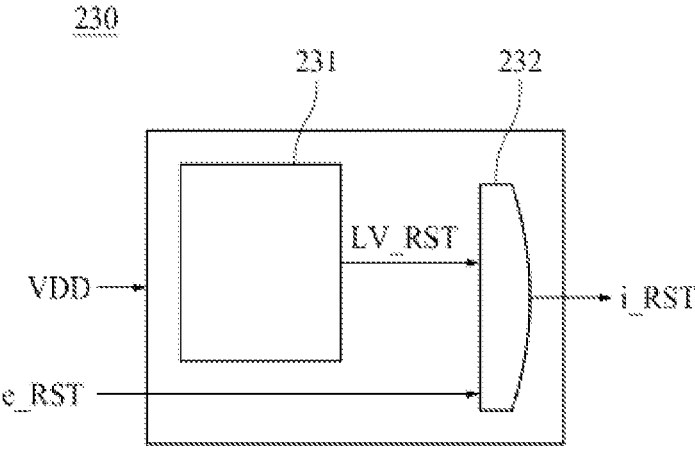
FIG. 3 is a block diagram of a reset circuit according to one embodiment of the present disclosure.

FIG. 2 is a schematic block diagram of a timing controller according to one embodiment of the present disclosure, and FIG. 3 is a block diagram of a reset circuit according to one embodiment of the present disclosure. FIG. 4 is a block diagram of a low voltage detecting circuit included in a reset circuit according to one embodiment of the present disclosure, and FIG. 5 is a timing diagram of data outputted from the reset circuit according to one embodiment of the present disclosure.

Referring to FIG. 2, a timing controller 200 according to one embodiment of the present disclosure includes a control signal generating circuit 210, a video signal converting circuit 220, and a reset circuit 230.

The control signal generating circuit 210 receives various timing signals including a vertical synchronization signal Vsync, a horizontal synchronization signal Hsync, a data enable signal DE, a clock signal CLK, and the like received from an external system and then generates a data control signal DCS for controlling the data driving unit 300 and a gate control signal GCS for controlling the gate driving unit 400.

In addition, the control signal generating circuit 210 may generate a touch synchronization signal Tsync that time-divisions one frame period into a display period and a touch sensing period according to a timing of an internal data enable signal iDE generated using the vertical synchronization signal Vsync and the data enable signal DE.

As described above, the video signal converting circuit 220 receives a video signal RGB from the external system, converts it into a video signal RGB' that may be processed by the data driving unit 140, and outputs the converted signal.

The reset circuit 230 receives an external reset signal e_RST and a power signal VDD and outputs an internal reset signal i_RST according to the received external reset signal e_RST and the received power signal VDD. The reset circuit 230 according to one embodiment of the present disclosure may reset the display device 10 and the timing controller 200 by controlling a signal outputted from the timing controller 200 to be initialized depending on a magnitude of the power signal VDD inputted to the timing controller 200. That is, the reset circuit 230 outputs the internal reset signal i_RST to at least one of the control signal generating circuit 210 and the video signal converting circuit 220 of the timing controller 200, thereby controlling at least one of the control signals DCS and GCS generated by the control signal generating circuit 210 of the timing controller 200 and the video signal RGB' converted by the video signal converting circuit 220 of the timing controller 200 to be outputted or not. For example, the reset circuit 230 may control the control signals generated by the control signal generating circuit 210 or the video signal RGB' converted by the video signal converting circuit 220 not to be outputted when the internal reset signal i_RST is data of logic "0". The reset circuit 200 may control the control signals generated by the control signal generating circuit 210 or the video signal RGB' converted by the video signal converting circuit 220 to be outputted when the internal reset signal i_RST is data of logic "1".

To this end, the reset circuit 230 includes a low voltage detecting circuit 231 and a reset signal output circuit 232, as shown in FIG. 3.

The low voltage detecting circuit 231 receives an input of a power signal VDD from the power supply unit 600, and initializes a signal outputted according to the magnitude of the power signal VDD. Specifically, when the inputted power signal VDD is a signal having a voltage lower than a threshold voltage of a first cell c1 that will be described later, the low voltage detecting circuit 231 outputs a low voltage reset signal LV_RST to the reset signal output circuit 232. Further, according to one embodiment of the present disclosure, the low voltage detecting circuit 231 outputs a low voltage reset signal LV_RST after a time taken to input the power signal VDD lower than the threshold voltage and a predetermined delay time t_delay have elapsed, in order to stably reset the timing controller 200 and the display device 10.

Figure 4:
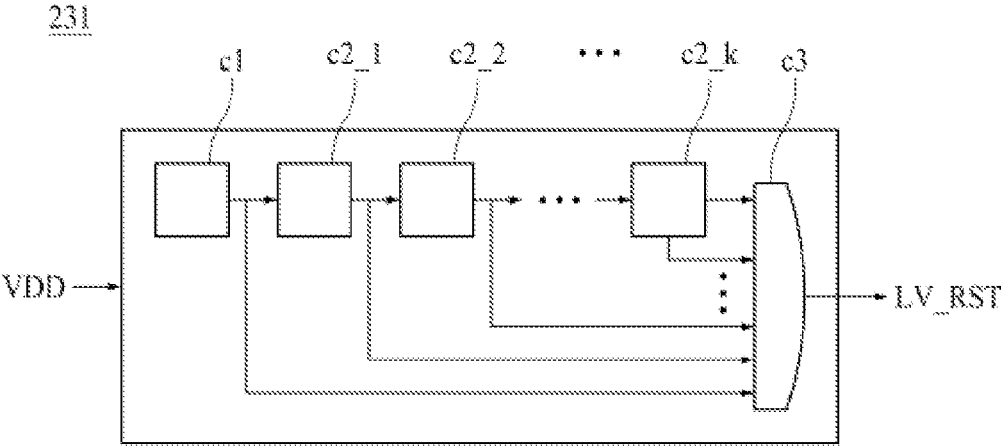
FIG. 4 is a block diagram of a low voltage detecting circuit included in a reset circuit according to one embodiment of the present disclosure.
Figure 5:
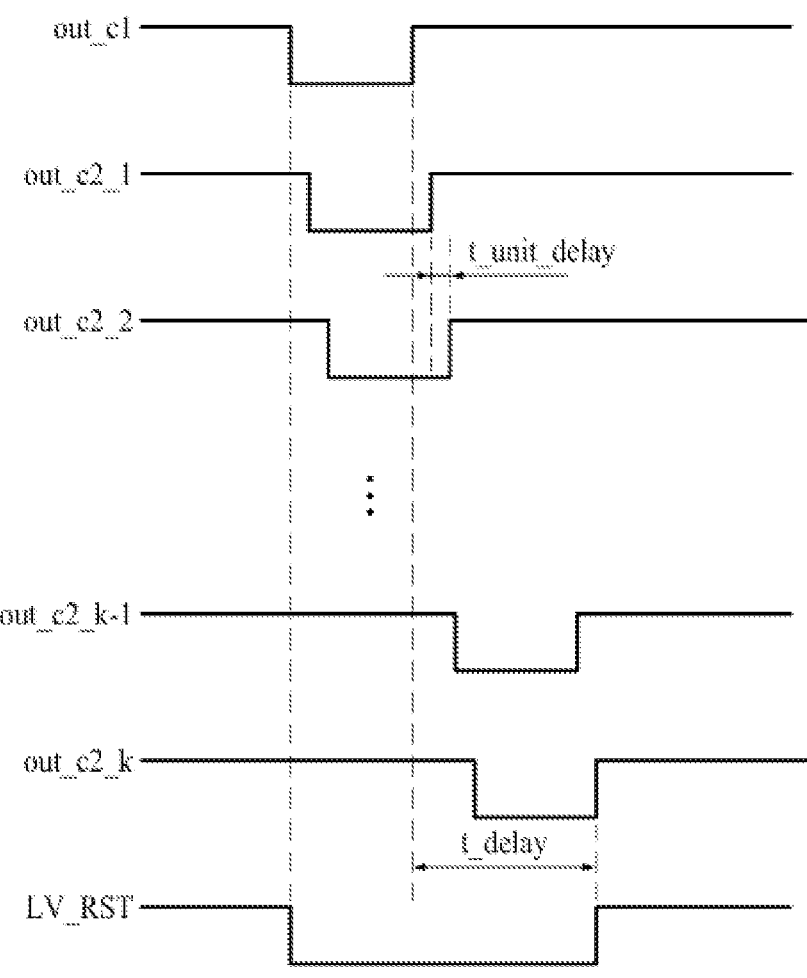
FIG. 5 is a timing diagram of data outputted from each cell according to one embodiment of the present disclosure.

To this end, as shown in FIG. 4, the low voltage detecting circuit 231 includes a first cell c1, at least one second cell c2, and a third cell c3. Each of the first cell c1, the second cell c2, and the third cell c3 may be configured as a standard cell. In this case, the standard cell may refer to a unit of a predefined integrated circuit, which corresponds to a circuit configured to perform a specific function.

According to one embodiment of the present disclosure, the first cell c1 may be a tie-high cell, which is one of the standard cells. The tie-high cell outputs a voltage corresponding to logic "1" while a voltage greater than a threshold voltage is inputted, and outputs a voltage corresponding to logic "0" while a voltage less than the threshold voltage is inputted. In this case, the threshold voltage is determined according to fabrication schedule variance of the tie-high cell, and each tie-high cell may have a different threshold voltage within an error range. For example, when a voltage of a power signal VDD corresponding to logic "1" is 5V and a voltage of a power signal VDD corresponding to logic "0" is a ground voltage GND, if a power signal VDD of 2.35V is inputted to one standard tie-high cell having a threshold voltage of 2.33V, the 5V that is the voltage corresponding to the logic "0" is outputted. If a power signal VDD of 2.35V is inputted to another standard tie-high cell having a threshold voltage of 2.37V, the ground voltage GND corresponding to logic "0" may be outputted. That is, it is not necessary to separately set a reference for detecting a low voltage, and the low voltage may be detected by using the threshold voltage of the standard tie-high cell according to the fabrication schedule variance of the standard tie-high cell.

The second cells c2_1 to c2_k (where k is a natural number greater than or equal to 1) may be a delay cell, which is one of the standard cells. The second cells c2_1 to c2_k, which are delay cells, delay input data for a predetermined delay time t_unit_delay and then output the delayed data. For example, one second cell may delay input data for 1 ms, which is a unit delay time t_unit_delay, and then output the delayed data.

One or more of the second cells c2_1 to c2_k are connected in series to each other and are also connected in series to the first cell c1, thereby outputting data outputted from the first cell c1 after delaying the data for a predetermined delay time t_delay as described above. Accordingly, the last second cell c2_k among k second cells c2_1 to c2_k connected in series (where k is a natural number greater than or equal to 1) outputs a signal after delaying the signal for k×t_unit_delay (1 ms) in comparison to a signal inputted to the first second cell c2_1.

The third cell c3 may include an AND gate circuit, or may be an AND gate cell that is one of the standard cells. That is, the third cell c3 outputs data of logic "1" when all of the received data are data of logic "1".

According to one embodiment of the present disclosure, the third cell c3 receives every data outputted from each of the first cell c1 and the at least one second cell c2. Accordingly, the third cell c3 outputs data having a voltage corresponding to logic "1" when all of the data outputted from the first cell c1 and the at least one second cell c2 are data of logic "1". Specifically, as shown in FIG. 5, a signal out_c1 outputted from the first cell c1 is inputted to the first second cell c2_1, delayed for a predetermined delay time t_unit_delay, and then outputted. A signal out_c2_1 is input to the second cell c2_2, delayed for a predetermined delay time t_unit_delay, and then outputted. A signal out_c2_k−1 outputted from the (k−1)th second cell c2_k−1 is inputted to the kth second cell c2_k, delayed for a predetermined delay time t_unit_delay, and then outputted. In this case, since the third cell c3 receives a signal outputted from each of the first cell c1 and the first to kth second cells c2_1 to c2_k, and outputs a voltage corresponding to logic "1" as a low voltage reset signal RST only when all of the received signals are voltages corresponding to logic "1", as shown in FIG. 5, the third cell c3 may further output a signal having a voltage corresponding to logic "0" for a delay time t_delay of k×t_unit_delay (1 ms) as a low voltage rest signal RST, according to the signal outputted from the first cell c1 and the signals out_c2_1 to out_c2_k outputted from the at least one or more second cells c2_1 to c2_k.

Accordingly, according to one embodiment of the present disclosure, the low voltage detecting circuit 231 outputs a voltage corresponding to the data of logic "1" as a low voltage reset signal LV_RST by the third cell c3 only when a voltage greater than the threshold voltage is inputted to the first cell c1 for a predetermined delay time t_delay and a voltage corresponding to the data of logic "1" is outputted from the first cell c1 and the at least one second cell c2. That is, when the voltage of the power signal VDD inputted to the low voltage detecting circuit 231 is maintained at the voltage corresponding to the data of logic "1" for the delay time t_delay, the data of logic "1" is outputted as the low voltage reset signal LV_RST. On the other hand, when the voltage of the power signal VDD inputted to the low voltage detecting circuit 231 is not maintained at the voltage corresponding to the data of logic "1" for the delay time t_delay, the low voltage reset signal LV_RST for resetting the timing controller 200 and the display device 10 is outputted.

Referring back to FIG. 3, the reset signal output circuit 232 receives the low voltage reset signal LV_RST outputted from the low voltage detection circuit 231 and an external reset signal e_RST and then outputs an internal reset signal i_RST. The reset signal output circuit 232 may include an AND gate circuit or may be an AND gate cell that is one of the standard cells. That is, when at least one of the low voltage reset signal LV_RST and the external reset signal e_RST has a voltage corresponding to data of logic "0", the reset signal output circuit 232 outputs the internal reset signal i_RST having a voltage corresponding to data of logic "0". When both the low voltage reset signal LV_RST and the external reset signal e_RST have a voltage corresponding to data of logic "1", the reset signal output circuit 232 outputs the internal reset signal i_RST having a voltage corresponding to data of logic "1" with the voltage corresponding to data of logic "1".

As described above, the reset signal output circuit 232 outputs the internal reset signal i_RST to at least one of the control signal generating circuit 210 and the video signal converting circuit 220 to control at least one of the control signals generated by the control signal generating circuit 210 of the timing controller 200 and the video signal RGB' converted by the video signal converting circuit 220 to be outputted or not to be outputted. For example, when the internal reset signal i_RST is data of logic "0", the reset circuit 230 may reset the timing controller 200 and the display device 10 by controlling at least one of the control signals generated by the control signal generating circuit 210 and the video signal RGB' converted by the video signal converting circuit 220 not to be outputted. When the internal reset signal i_RST is data of logic "1", the reset circuit 230 may control the control signals generated by the control signal generating circuit 210 or the video signal RGB' converted by the video signal converting circuit 220 to be outputted.

Figure 6:
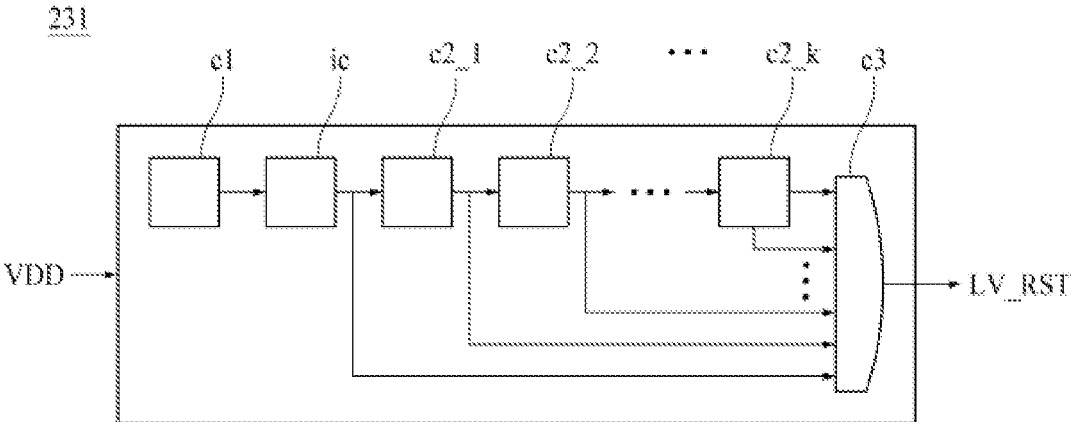
FIG. 6 is a block diagram of a low voltage detecting circuit included in a reset circuit according to another embodiment of the present disclosure.

Hereinafter, a low voltage detecting circuit according to another embodiment of the present disclosure will be described in detail with reference to FIG. 6. FIG. 6 is a block diagram of a low voltage detecting circuit included in a reset circuit according to another embodiment of the present disclosure.

Referring to FIG. 6, a low voltage detecting circuit 231 according to another embodiment of the present disclosure includes a first cell c1, an inverter cell i_c, at least one second cell c2, and a third cell c3. The first cell c1, the inverter cell i_c, the second cell c2, and the third cell c3 may include standard cells.

According to another embodiment of the present disclosure, the first cell c1 may be a tie-low cell, which is one of the standard cells. The tie-row cell outputs a voltage corresponding to logic "0" when a voltage greater than a threshold voltage is inputted, and outputs a voltage corresponding to logic "1" when a voltage less than the threshold voltage is inputted. In this case, the threshold voltage is determined according to fabrication schedule variance of the tie-row cell, and each tie-row cell may have a different threshold voltage within an error range. For example, when a voltage of a power signal VDD corresponding to logic "1" is 5V and a voltage of the power signal VDD corresponding to logic "0" is a ground voltage GND, if the power signal VDD of 2.35V is inputted to one standard tie-row cell having a threshold voltage of 2.33V, the ground voltage GND corresponding to logic "0" is outputted. If the power signal VDD of 2.35V is inputted to another standard tie-row cell having a threshold voltage of 2.37V, the voltage of 5V, which is the voltage corresponding to logic "1", may be outputted. That is, it is not necessary to separately set a reference for detecting a low voltage, and the low voltage may be detected by using the threshold voltage of the standard tie row cell according to the fabrication schedule variance of the standard tie row cell.

According to another embodiment of the present disclosure, the low voltage detecting circuit 231 may include the inverter cell i_c for inverting a signal outputted from the first cell c1 with respect to a center voltage. In this case, the inverter cell i_c may be an inverter element or an inverter cell that is one of standard cells. Accordingly, when the first cell c1, which is a tie-row cell, outputs a voltage corresponding to logic "1", the inverter cell i_c may convert it into a voltage corresponding to logic "0". When the first cell c1 outputs the voltage corresponding to logic "0", the inverter cell i_c may convert it into a voltage corresponding to logic "1". Yet, the present disclosure is non-limited thereto, and the low voltage detecting circuit 231 may include an inverter cell i_c, which inverts a power signal VDD with respect to the center voltage and then outputs the inverted power signal to the first cell c1.

The second cells c2_1 to c2_k (where k is a natural number greater than or equal to 1) may be a delay cell, which is one of the standard cells. The second cells c2_1 to c2_k, which are the delay cells, delay input data for a predetermined delay time t_unit_delay and then output the delayed data.

The at least one or more second cells c2_1 to c2_k are connected in series to each other and are also connected in series to the first cell c1, thereby further outputting a signal outputted from the first cell c1 for a time taken to input a signal and a predetermined delay time t_delay, as described above. Accordingly, the last second cell c2_k among the k second cells c2_1 to c2_k connected in series outputs a signal after delaying it for k×t_unit_delay (1 ms) in comparison with the signal inputted to the first second cell c2_1 (where k is a natural number greater than or equal to 1).

The third cell c3 may be an AND gate cell may include an AND gate circuit or may be an AND gate cell that is one of the standard cells. That is, the third cell c3 outputs data of logic "1" when all of the input data are data of logic "1".

According to one embodiment of the present disclosure, the third cell c3 receives every data outputted from each of the first cell c1 and the at least one second cell c2. Accordingly, when all of the data outputted from the first cell c1 and the at least one second cell c2 are data of logic "1", the third cell c3 outputs data having a voltage corresponding to logic "1".

It will be appreciated by those skilled in the art to which the present disclosure belongs that the disclosure described above may be practiced in other specific forms without altering its technical ideas or essential features.

In addition, the methods described herein may be implemented at least in part using one or more computer programs or components. The components may be provided as a series of computer instructions through a computer-readable medium or a machine-readable medium comprising volatile and nonvolatile memory. The instructions may be provided as software or firmware and may be implemented in a hardware configuration such as ASICs, FPGAs, DSPs, or other similar elements in whole or in part. The instructions may be configured to be executed by one or more processors or other hardware configurations, which enable the processor or other hardware configuration to perform all or part of the methods and procedures disclosed herein when executing the series of computer instructions.

It should therefore be understood that the embodiments described above are exemplary and non-limiting in all respects. The scope of the present disclosure is defined by the appended claims, rather than by the detailed description above, and should be construed to cover all modifications or variations derived from the meaning and scope of the appended claims and the equivalents thereof.

What is claimed is:

1. A reset circuit, comprising:

a low voltage detecting circuit configured to receive a power signal and output a low voltage reset signal, the low voltage detecting circuit comprising:

a first cell configured to receive the power signal and output a voltage corresponding to logic "0" based on the power signal being smaller than a threshold voltage or a voltage corresponding to logic "1" based on the power signal being greater than the threshold voltage;

at least one second cell connected in series to the first cell and configured to output a signal inputted from the first cell after delaying the signal for a predetermined delay time; and a third cell configured to output the low voltage reset signal by receiving all signals outputted from the first cell and the at least one second cell.

2. The reset circuit of claim 1, wherein the low voltage detecting circuit is further configured to output the low voltage reset signal corresponding to logic "0" for a time taken to receive the power signal of a voltage corresponding to the logic "0" and a predetermined delay time based on the power signal being the voltage corresponding to the logic "0".

3. The reset circuit of claim 1, wherein the first cell comprises a tie-high cell as one of standard cells and wherein the at least one second cell comprises a delay cell as one of the standard cells.

4. The reset circuit of claim 1, further comprising an inverter cell connected to the first cell and configured to invert a signal with respect to a center voltage, wherein the first cell comprises a tie-high cell as one of standard cells and wherein the at least one second cell comprises a delay cell as one of the standard cells.

5. The reset circuit of claim 1, wherein the third cell comprises an AND cell as one of an AND gate circuit or a standard cell.

6. The reset circuit of claim 1, wherein the at least one second cell is connected in series to each other.

7. The reset circuit of claim 1, further comprising a reset signal output circuit configured to output an internal reset signal by receiving an external reset signal and the low voltage reset signal, wherein the reset signal output circuit comprises an AND cell as one of an AND gate circuit or a standard cell.

8. A reset circuit, comprising:

a low voltage detecting circuit configured to receive a power signal and output a low voltage reset signal, the low voltage detecting circuit comprising:

a first cell comprising a tie-high cell among standard cells;

at least one second cell comprising a delay cell among the standard cells; and a third cell configured to output the low voltage reset signal by receiving all signals outputted from the first cell and the at least one second cell.

9. The reset circuit of claim 8, wherein the low voltage detecting circuit is further configured to output the low voltage reset signal corresponding to logic "0" for a time taken to receive the power signal of a voltage corresponding to the logic "0" and a predetermined delay time based on the power signal being the voltage corresponding to the logic "0".

10. The reset circuit of claim 8, wherein the third cell comprises an AND cell as one of an AND gate circuit or a standard cell.

11. The reset circuit of claim 8, wherein the at least one second cell is connected in series to each other.

12. The reset circuit of claim 8, further comprising a reset signal output circuit configured to output an internal reset signal by receiving an external reset signal and the low voltage reset signal, wherein the reset signal output circuit comprises an AND cell as one of an AND gate circuit or a standard cell.

13. A timing controller, comprising:

a control signal generating circuit configured to generate a data control signal and a gate control signal based on timing signals received from an external system;

a video signal converting circuit configured to convert and output a video signal received from the external system; and a reset circuit configured to reset the control signal generating circuit and the video signal converting circuit by receiving a power signal and an external reset signal and outputting an internal reset signal to at least one of the control signal generating circuit or the video signal converting circuit, the reset circuit comprising:

a low voltage detecting circuit configured to receive a power signal and output a low voltage reset signal, the low voltage detecting circuit comprising:

a first cell configured to receive the power signal and output a voltage corresponding to logic "0" based on the power signal being smaller than a threshold voltage or a voltage corresponding to logic "1" based on the power signal being greater than the threshold voltage;

at least one second cell connected in series to the first cell and configured to output a signal inputted from the first cell after delaying the signal for a predetermined delay time; and a third cell configured to output the low voltage reset signal by receiving all signals outputted from the first cell and the at least one second cell.

14. The timing controller of claim 13, wherein the low voltage detecting circuit is further configured to output the low voltage reset signal corresponding to logic "0" for a time taken to receive the power signal of a voltage corresponding to the logic "0" and a predetermined delay time based on the power signal being the voltage corresponding to the logic "0".

15. The timing controller of claim 13, wherein the first cell comprises a tie-high cell as one of standard cells and wherein the at least one second cell comprises a delay cell as one of the standard cells.

16. The timing controller of claim 13, further comprising an inverter cell connected to the first cell and configured to invert a signal with respect to a center voltage, wherein the first cell comprises a tie-high cell as one of standard cells and wherein the at least one second cell comprises a delay cell as one of the standard cells.

17. The timing controller of claim 13, wherein the third cell comprises an AND cell as one of an AND gate circuit or a standard cell.

18. The timing controller of claim 13, wherein the at least one second cell is connected in series to each other.

19. The timing controller of claim 13, further comprising a reset signal output circuit configured to output an internal reset signal by receiving an external reset signal and the low voltage reset signal, wherein the reset signal output circuit comprises an AND cell as one of an AND gate circuit or a standard cell.

* * * * *